(12) United States Patent
Hoole et al.

(10) Patent No.: US 10,949,584 B2
(45) Date of Patent: Mar. 16, 2021

(54) DEFECT DETECTION SYSTEM USING FINITE ELEMENT OPTIMIZATION AND MESH ANALYSIS

(71) Applicants: BOARD OF TRUSTEES OF MICHIGAN STATE UNIVERSITY, East Lansing, MI (US); SECRETARY OF THE ARMY, Washington, DC (US)

(72) Inventors: S. Ratnajeevan H. Hoole, Okemos, MI (US); Sivamayam Sivasuthan, East Lansing, MI (US); Victor Uthayakumar Karthik, East Lansing, MI (US); Paramsothy Jayakumar, Warren, MI (US); Ravi S. Thyagarajan, Novi, MI (US); Lalita Udpa, Okemos, MI (US); Arunasalam Rahunanthan, Centerville, OH (US)

(73) Assignees: BOARD OF TRUSTEES OF MICHIGAN STATE UNIVERSITY, East Lansing, MI (US); SECRETARY OF THE ARMY, Washington, DC (US)

( * ) Notice: Subject to any disclaimer, the term of this patent is extended or adjusted under 35 U.S.C. 154(b) by 445 days.

(21) Appl. No.: 15/160,453

(22) Filed: May 20, 2016

(65) Prior Publication Data
US 2016/0343106 A1 Nov. 24, 2016

Related U.S. Application Data

(60) Provisional application No. 62/165,795, filed on May 22, 2015.

(51) Int. Cl.
*G06F 30/23* (2020.01)

(52) U.S. Cl.
CPC ................................ *G06F 30/23* (2020.01)

(58) Field of Classification Search
CPC ........................... G06F 17/5018; G06F 30/23
USPC .......................................................... 703/2
See application file for complete search history.

(56) References Cited

PUBLICATIONS

Jayakumar et al., Finite Elements, Design Optimization, and Non-destructive Evaluation: A Review in Magnetics, and Future Directions in GPU-based, Element-by-Element Coupled Optimization and NDE, Jul. 18, 2013, pp. 1-21 (Year: 2013).*
Karthik et al., Inversion of Heavy Current Electroheat Problems on a Graphics Processing Unit (GPU), Nov. 10, 2013, pp. 1-17 (Year: 2013).*
Cecka et al., "Assembly of Finite Element methods on Graphics Processors", 2011, Int. J. Num. Meth. Eng., vol. 85, No. 5, pp. 640-669 (Year: 2011).*
Richard M. Fujimoto, "Parallel discrete event simulation", 1990, Communications of the ACM 33.10, pp. 30-53 (Year: 1990).*
Richard M. Fujimoto, Parallel and Distributed Simulation, 1999, Proceedings of the 1999 Winter Simulation Conference, pp. 122-131.*

(Continued)

*Primary Examiner* — Juan C Ochoa
(74) *Attorney, Agent, or Firm* — Marshall, Gerstein & Borun LLP

(57) ABSTRACT

A defect detection system uses dedicated, simultaneously operating finite element optimization and mesh generation. Using an Eddy-current based probe, the system can detect and model surface and sub-surface defects.

12 Claims, 13 Drawing Sheets

(56) References Cited

PUBLICATIONS

Sivamayam Sivasuthan, The General Purpose Parameter Based Two Dimensional Mesh Generator, Apr. 4-5, 2014, ASEE North Central Section Conference, pp. 1-9.*

Sivasuthan et al., "CUDA Memory Limitation in Finite Element Optimization to Reconstruct Cracks", 2014, AIP Conference Proceedings 1581, pp. 1967-1974.*

Hoole et al., Electromagnetic device optimization: the forking of already parallelized threads on graphics processing units, ACES J., 29(9):677-94 (2014).

Hoole et al., Finite elements, design optimization, and nondestructive evaluation: A review in magnetics, and future directions in GPU-based, element-by-element coupled optimization and NDE, Int. J. Appl. Electromagnet. Mechanics, 47:607-27 (2015).

Hoole et al., Flip-teaching engineering optimization, electromagnetic product design, and nondestructive evaluation in a semester's course, Computer Applications in Engineering Education, 23(3):374-82 (2015).

Hoole et al., Inverse problem methodology and finite elements in the identification of inaccessible locations, sources, geometry and materials, IEEE Trans. Mag., 27(3):3433-43 (1991).

Hoole et al., Optimization algorithms for magnetics and their parallelizability, IEEE Trans. Magn., 33(2):1966-9 (1997).

Hoole, Finite element electromagnetic field computation on the sequent symmetry 81 parallel computer, IEEE Trans. on Magnetics, 26(2):837-40 (1990).

Hoole, *Finite Elements, Electromagnetics and Design*, Amsterdam: Elsevier (1995).

Karthik et al., Faster, more accurate, parallelized inversion for shape optimization in electroheat problems on a graphics processing unit (GPU) with the real-coded genetic algorithm, COMPEL (2014).

Karthik et al., Finite element optimization for nondestructive evaluation on a graphics processing unit for ground vehicle hull inspection, 2013 NDIA Ground Vehicle Systems Engineering and Technology Symposium, Troy Michigan (Aug. 21, 2013).

Kim et al., Multi-stage adaptive noise cancellation for ultrasonic NDE, NDT&E International, 34:319-28 (2001).

Preis et al., FEM and evolution strategies in the optimal design of electromagnetic devices, IEEE Trans Magnetics, 26(5):2181-3 (1990).

Reyes-Rodriguez et al., Time reversal and microwave techniques for solving inverse problem in non-destructive evaluation, NDT&E International, 62:106-14 (2014).

Robilliard et al., Genetic programming on graphics processing units, Genetic Programming and Evolvable Machines, 10(4):447-71 (2009).

Shewchuk, Triangle: engineering a 2D quality mesh generator and Delaunay triangulator, Applied Computational Geometry: Towards Geometric Engineering, Lecture Notes in Computer Science, vol. 1148, Springer: Berlin, pp. 203-222 (1996).

Sivasuthan et al., A script-based, parameterized finite element mesh for design and NDE on a GPU, IETE Technical Review (2014).

Sivasuthan et al., A script-based, parameterized mesh generator library for coupled gradient design and NDE, 16th Biennial IEEE Conference on Electromagnetic Field Computation, Annecy France (May 2014).

Sivasuthan et al., A script-based, parameterized mesh generator library for the design of coupled field systems as well as for non-destructive evaluation, The 16th Biennial IEEE Conference on Electromagnetic Field Computation (2014).

Sivasuthan et al., Addressing memory and speed problems in nondestructive defect characterization: element-by-element processing on a GPU, J. Nondestruct. Eval., 34:9 (2015).

Sivasuthan et al., GPU computation: Why element by element conjugate gradients, The 16th Biennial IEEE Conference on Electromagnetic Field Computation (2014).

Subramaniam et al., Optimization of a magnetic pole face using linear constraints to avoid jagged contours, IEEE Trans on Magnetics, 30(5):3455-8 (1994).

Toledo et al., Global optimization using a genetic algorithm with hierarchically structured population, J. Computational Appl. Mathematics, 261(1):341-51 (2014).

Tong et al., Beam steering and adaptive nulling of low sidelobe level time-modulated linear array, Proceedings of the 5th European Conference on Antennas and Propagation (EUCAP), Rome, Italy, pp. 948-951 (2011).

Wong et al., Implementation of parallel genetic algorithms on graphics processing units, IN: Gen et al. (eds.), Intelligent and Evolutionary Systems, vol. 187 of the series Studies in Computational Intelligence, pp. 197-216 (2009).

Yang et al., Pulsed eddy current based GMR system for the inspection of aircraft structures, IEEE Trans. Mag., 46:910-7 (2010).

* cited by examiner

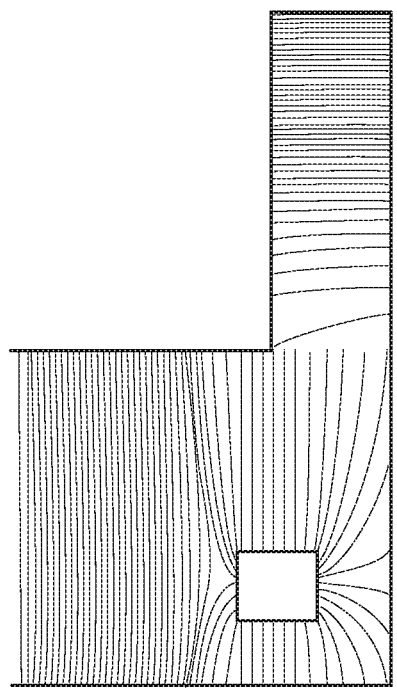
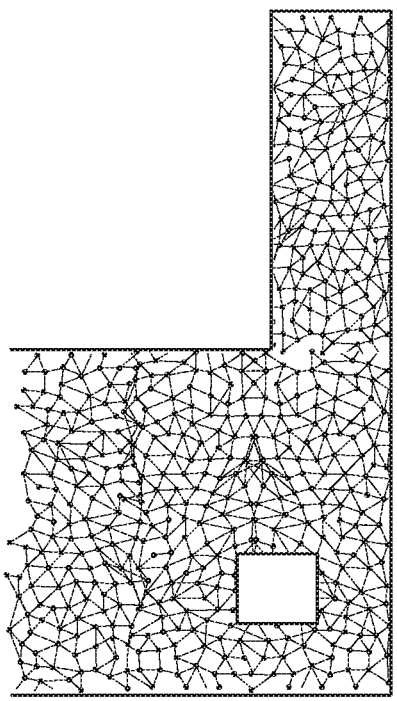
FIG. 6A
FIG. 6B

DEFECT DETECTION SYSTEM USING FINITE ELEMENT OPTIMIZATION AND MESH ANALYSIS

CROSS-REFERENCE TO RELATED APPLICATIONS

This application claims the benefit of U.S. Provisional Application Ser. No. 62/165,795, filed May 22, 2015, entitled "Electromagnetics And Finite Element Optimizer To Reconstruct And Classify Corrosion And Battle Vehicle Damage Using Eddy Current Testing" the entirety of which is hereby incorporated herein by reference.

STATEMENT OF GOVERNMENT INTEREST

This invention was made with government support under W911NF-11-D-0001 and under W56HZV-07-2-0001 awarded by the U.S. Army. The government has certain rights in the invention.

FIELD OF THE INVENTION

The present disclosure relates generally to using finite element analysis in analyzing defects in a material structure and, more particularly, to performing finite element analysis through continuous optimization iterations.

BACKGROUND

The background description provided herein is for the purpose of generally presenting the context of the disclosure. Work of the presently named inventor, to the extent it is described in this background section, as well as aspects of the description that may not otherwise qualify as prior art at the time of filing, are neither expressly nor impliedly admitted as prior art against the present disclosure.

When a hull or other plate in a military ground vehicle is found to be defective, whether through corrosion or improvised explosive device attacks, the plate is taken out of service for repairs without determining if the defect warrants withdrawal or not, even though many defects are minor and withdrawal is wasteful. The same occurs with defects caused by visible surface corrosion. On the other hand, known major defects are deep and hidden and go unaddressed because they are invisible to the naked eye. It is most important, therefore, in the interests of safety and effectiveness to identify and characterize, through routine inspection, the presence of interior and surface defects—thin crack, volume corrosion, spall, etc.—and to characterize their depth and shape so that a proper decision to withdraw may be made.

There is a need for a portable system that can characterize corrosion damage and/or damage from improvised explosive devices (IED) quickly in deployed applications.

SUMMARY OF THE INVENTION

Techniques are described that use eddy current measurements on the surface of a metallic plate being inspected. The techniques employ a parallel processing system to perform finite element analysis and shape optimization to identify defects under the surface and to identify the particular shapes of those defects. The finite element analysis is implemented in a parallel and continuous manner. Finite element modeling is performed on a system mathematically described by parameters, in an iterative manner. That finite element model iteratively receives (i) self-correcting input values to yield a second system for the next iteration and (ii) applies a mesh generator module that produces the self-correction values, thereby optimizing the first system's shape for the next finite element model.

In accordance with an example, an eddy current defect characterization system comprises: an eddy current probe adapted to produce a changing magnetic field extending outwardly from the probe to induce eddy currents in an electrically conducting specimen, wherein the probe includes a sensing coil to detect a flux change from a state where there is no defect over the conducting specimen in response to the induced eddy currents; a mesh analysis system having one or more main processors and one or more dedicated graphics processing unit (GPU) threads, the mesh analysis system having: one or more non-transitory computer readable memories coupled to the one or more processors and to the one or more GPU threads, wherein the one or more memories include computer-executable instructions stored therein that, when executed by the one or more main processors or the one or more GPU threads, cause the one or more main processors or the one or more GPU threads to; in response to detecting the flux in the specimen, generate, in the one or more main processors, a plurality of finite element mesh models of a defect in the specimen; in parallel, (i) provide each of the plurality of finite element mesh models to a different one of the GPU threads, and (ii) perform, in each of the GPU threads, a finite element optimization on the respective finite element mesh model, and perform either (iii) or (iv), (iii) continuously communicate the finite element optimizations from the one or more GPU threads to the one or more main processors as an input to the finite element mesh model's mesh generation procedure; or (iv) evaluate, in each of the GPU threads, an objective function for each respective finite element mesh model using a genetic algorithm to identify one or more optimized finite element mesh models, and in response to the genetic algorithm evaluation, continuously communicate the one or more optimized finite element mesh models to the one or more processors to serve as an input to the finite element mesh model generation process; continue to generate the plurality of finite element mesh models of the defect in the specimen until at least one of the finite element mesh models satisfies a minimum objective function value.

In accordance with another example, a computer-implemented method of identifying a defect in a specimen, the method comprises: (a) receiving, from an eddy current probe, measure voltage profile data from scanning the specimen for a defect, wherein the measured voltage profile data includes flux change data when the defect is encountered in the specimen; (b) generating a plurality of finite element mesh models from the measured voltage profile data; (c) performing, in parallel, a finite element optimization on each of the plurality of finite element mesh models using Gauss iterations; (d) determining, in parallel and from the finite element optimizations, computed voltage profile data and determining an objective function for each of the plurality of finite element mesh models by determining a square of the difference between the measured voltage profile data and computed profiles; (e) optimizing, in parallel, each of the objective functions using a genetic algorithm optimization; and (f) determining the objective function having a minimum value set of parameters as describing the defect.

BRIEF DESCRIPTION OF THE DRAWINGS

FIGS. 6A and 6B illustrate example points in an optimization defect detection performed by the system of FIG. 1.

DETAILED DESCRIPTION

Figure 1:
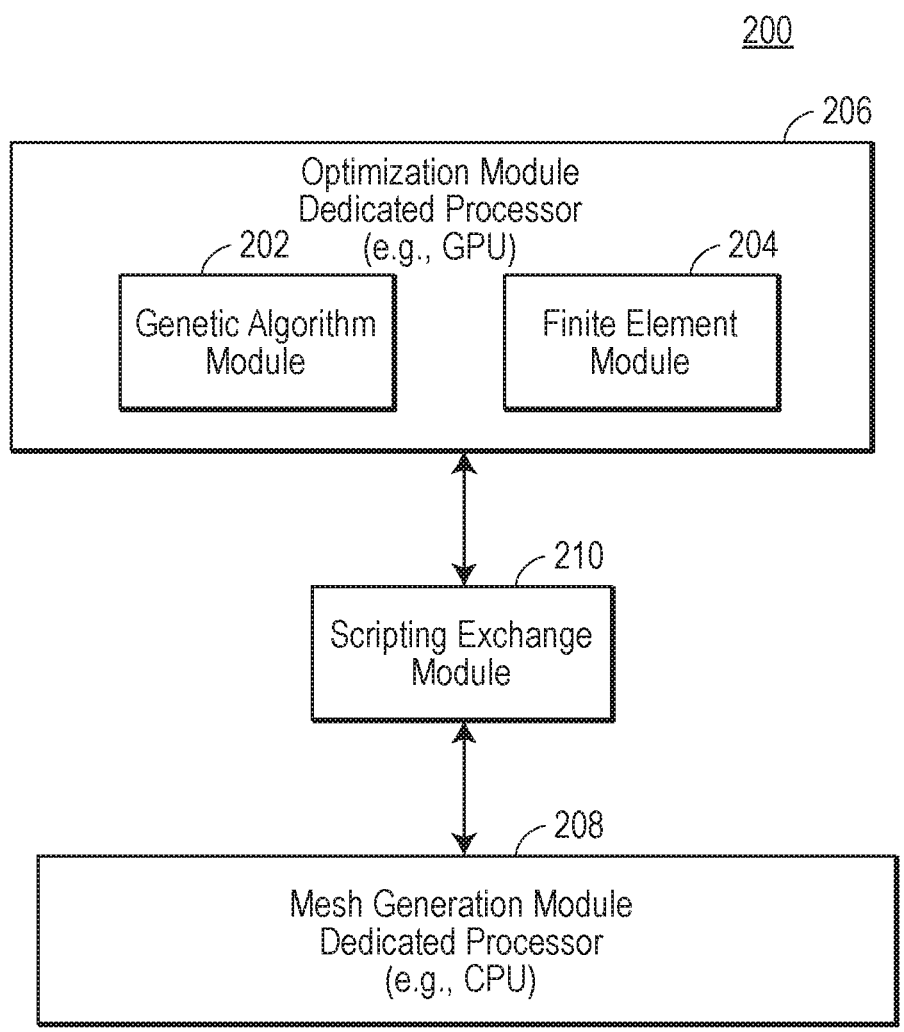
FIG. 1 is a schematic illustration of a control system for detecting and modeling defects in a sample.

The present techniques provide a nondestructive evaluation (NDE) system that uses eddy current probes to detect the presence of defects in a substrate and to characterize those defects, based on shape, depth, corrosion, etc. With the present techniques, both outer surface and interior defects can be identified, whether from thin crack defects, volume corrosion, spall, or other mechanisms known to affect ground vehicle structure and ground vehicle armor. While the present techniques are described in reference to eddy current testing, other testing/probe modalities may be used, including ultrasonic testing, radiography and thermography.

Finite element mesh generators exist in the public domain and are used for both the design and non-destructive evaluation (NDE) of material structures. The analysis requires that certain parameters are defined, e.g., lengths, widths, etc. that describe and define geometries and are used for shape optimizations. The present techniques are not able to efficiently and effectively create actual geometries (shaping) meeting design specs or NDE measurements.

Conventional mesh generators require some man-machine interaction to define the key points of a shape and boundary conditions. The generators are not dynamic; they are not equipped to achieve non-stop optimization iterations; that is, they are not equipped to handle constantly changing optimization variables and parameters. By contrast, the present techniques employ mesh generators, open source and otherwise, that employ a script controlled architecture that allows for non-stop run-time optimization. The techniques are thus able to provide a non-destructive evaluation (NDE) system for detecting and characterizing defects in ground vehicles, for machine design, as well as other applications.

Starting with specific values of parameters, the present techniques define a finite element mesh. From here, the present techniques are used to solve an associated field problem and compute an objective function, F, which may be the square of the difference between desired performance and computed performance. In device design applications, the performance metric(s) may be force, inductance, or other metrics. In NDE analysis applications, the performance metric(s) is typically the difference between the electric field measured and that computed. The objective function, F, therefore will depend on (i.e., is a function of) the parameters and is to be minimized (that is, the desired and computed performance must match).

To effect mesh generation, parameter values may be changed throughout the optimization process. Those changes give rise to new solutions to the objective function, F, which results in the generation of a new mesh. But conventional mesh generators do not operate a continuous, iterative process. Instead, they must stop the mesh generation process, in order to have new parameter values fed to the mesh generator, after which the mesh generation process resumes. This interrupted operation presents a well-known limitation in conventional mesh generators, a limitation that is particularly problematic for complex shape optimization, where hundreds or thousands of iterations will be needed. The way conventional processes try to get around the problem is to have the same mesh with the same nodal connections as the parameters change and to vary only the coordinates of the mesh. This end-around needs no new mesh generation and only the nodal coordinates would change in the data files.

In contrast, the present techniques allow for continuous, iterative mesh generation in each cycle throughout the entire optimization process. Using a completely different architecture for optimization, the process does not constrain mesh generation to nodal changes only, but rather allows full mesh generation with new model connectors during each cycle, from iteration to iteration. Moreover, the architecture can be implemented using commercial or open source mesh generators, with processing architectures and executable scripts that make the optimization process loop, nonstop from iteration to iteration seamlessly. For example, the script instructions ensure that the inputs required for the mesh are written on to files at the end of an iteration and read seamlessly for the next iteration. To manage processing demands and to create an environment that facilitates this continuous run-time optimization, the mesh generator may be implemented on a first processor device, such as a central processing unit (CPU), while the finite element optimization may be implemented on a second processor device, such as a dedicated graphics processing unit (GPU), as discussed in examples described herein.

FIG. 1 illustrates an example eddy current testing (ECT) system 200, in which an eddy current coil scans an object being tested while the response field is measured. When the response field is altered by a defect, the defect is detected and characterized. FIG. 1 illustrates a design/defect detection system 200 having an optimization module 202 (e.g., implementing a genetic algorithm) and finite element (FE) module 204 in a first dedicated processing unit, such as a graphic processing unit 206. The optimization module 202 and the FE module 204 are stored (at least during runtime) and executable on this first dedicated processing unit. FIG. 1 also illustrates a separate mesh generator module, e.g., implementing a mesh generator Triangle (as discussed herein), that is stored (at least during runtime) and executable on a second dedicated processing unit, such as a central processing unit 208. Each dedicated processing unit includes multiple separate processing GPU threads, executing independently of the other dedicated processing threads. To achieve continuous optimization, a scripting exchange module 210 is coupled between dedicated processing threads and facilitates communication of data between them, as discussed herein, for example, by providing new parameter input values to the mesh generator module 208 in each iterative cycle, until the optimization conditions are met.

Figure 2:
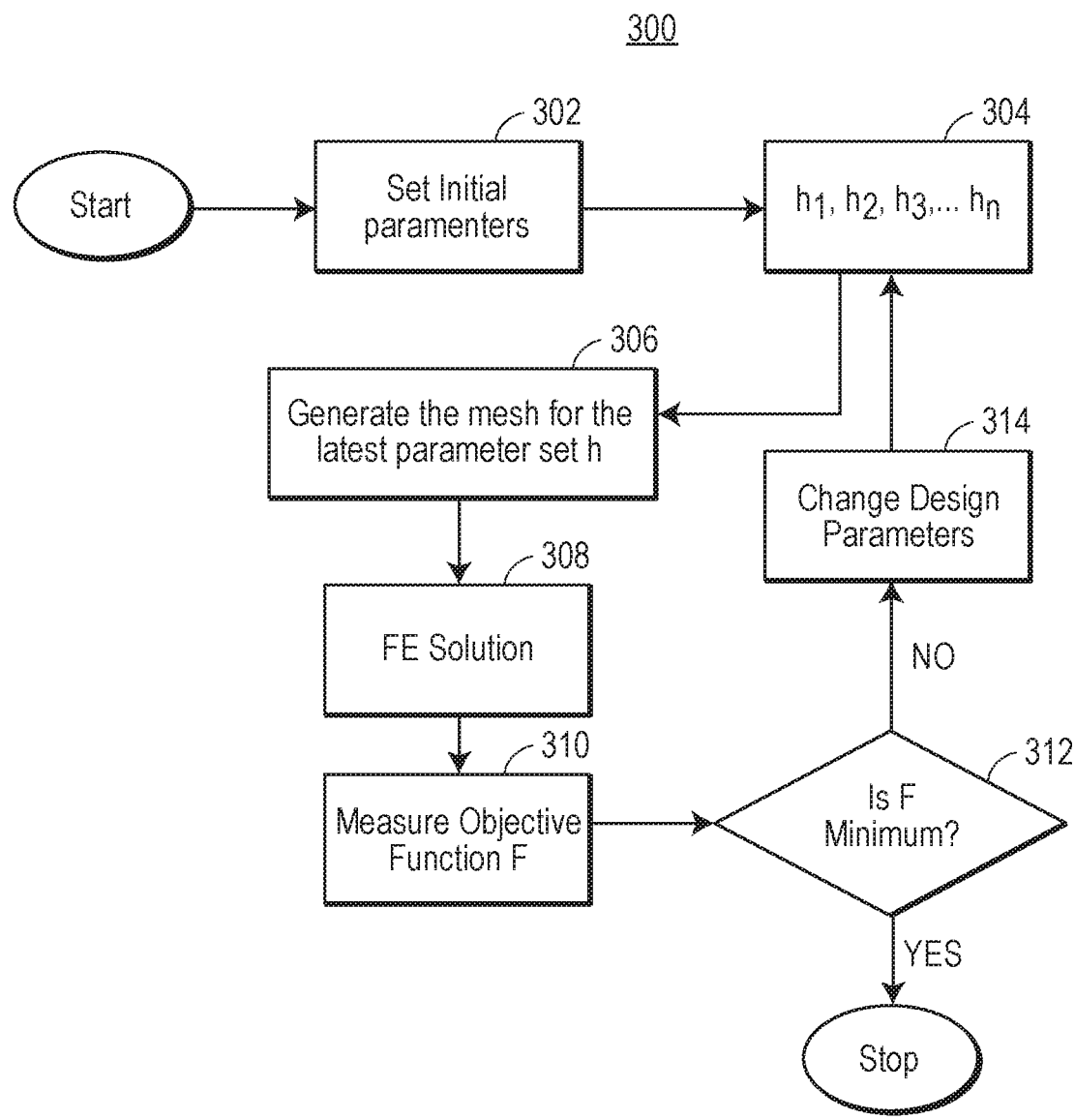
FIG. 2 illustrates a process for an optimization process that may be performed by the system of FIG. 1.

FIG. 2 illustrates an example design optimization process 300 as implemented in accordance with the present techniques. The design would occur for one mesh shape for one thread, where the optimization would occur for multiple meshes each of different shape and in parallel. In a first step, a block 302 design parameter set {h} is randomly selected (or estimated) and provided by block 304. From there the process generates a corresponding mesh (306), from which the process determines the finite element solution (308), and measures the objective value (310) (e.g., the least-square difference between design objectives desired and computed). The process then determines whether the objective value is set to a minimum or not (312).

If the objective value is a minimum, then the process terminates the loop; otherwise, the process changes the design parameters and repeats the same procedure in the next design cycle. This process repeats until the objective value is acceptably small. The optimization can go on non-stop, and a new mesh can be generated each cycle based on the new input parameters determined from the previous cycle, without user intervention. Further, the process happens in parallel where multiple meshes are generated and FE solutions are obtained, in each thread, after which the objective function for each is determined, and collectively the objective functions are compared and used to change design parameters for the next cycle of mesh generation.

Figure 3:
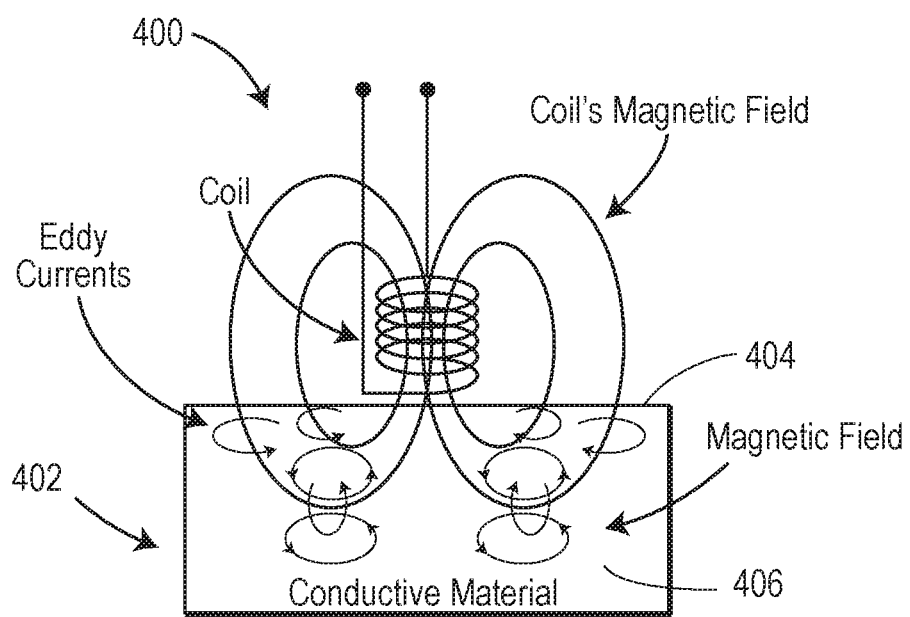
FIG. 3 illustrates operation of an eddy current-based probe that may be used with the system of FIG. 1.

While FIG. 2 illustrates an optimization cycle for a design process, the same procedures can be used for defect detection. FIG. 3 illustrates an example operation of an eddy current probe 400 performing a detection analysis on a sample 402. The eddy current probe 400 detects defects at a surface 404 and below a surface 406 of the sample 402. To detect the presence of cracks away from the surface, the eddy current probe 400 produces fields of lower frequencies that penetrate into the sample 402. Surface defects are generally captured by higher frequency signals produced by the probe 400. Therefore, to obtain a full image, the probe 400 may produce a range of frequencies, for example through the use of pulsed excitation, i.e., pulsed eddy current testing.

Figure 4:
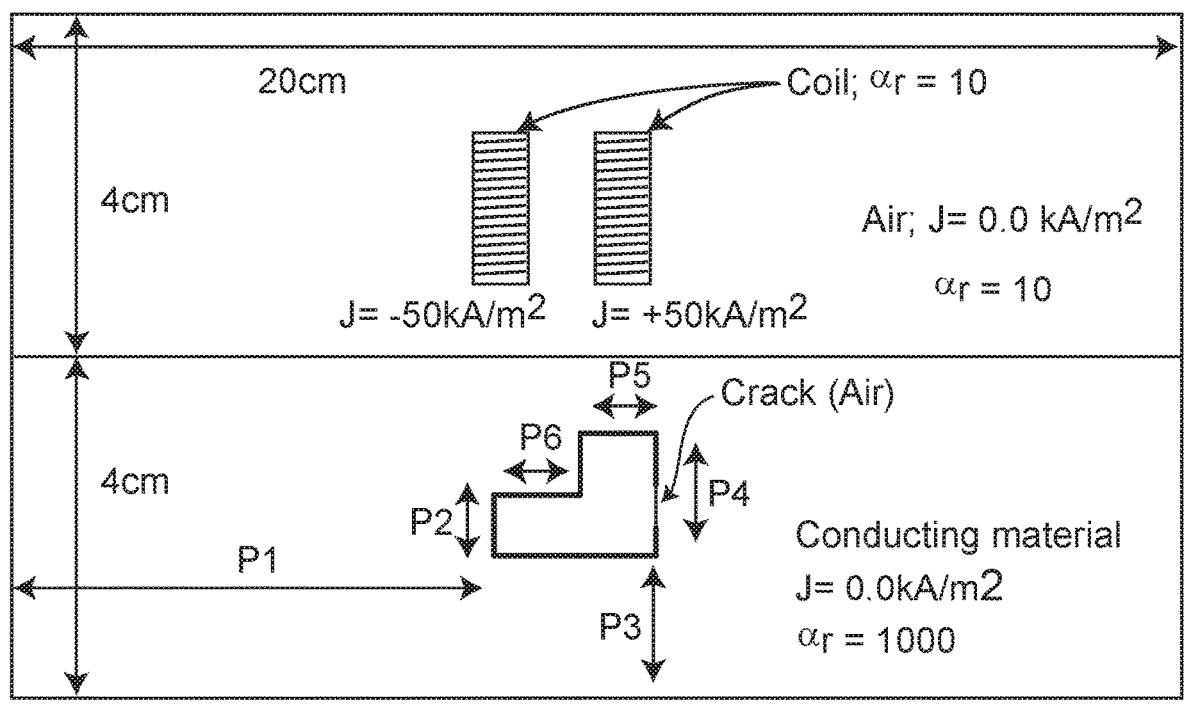
FIG. 4 illustrates a probe configuration for parametric defect detection.
Figure 5:
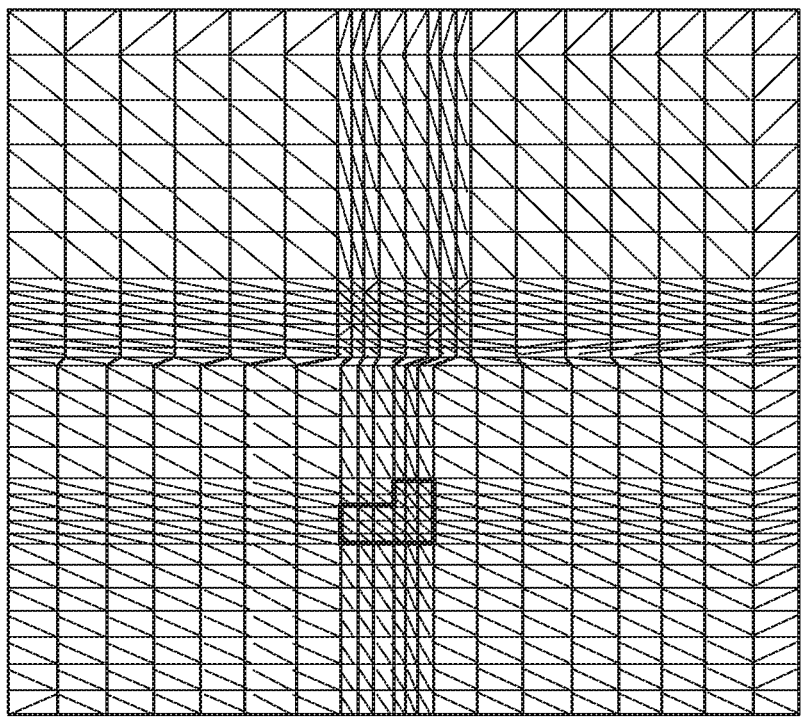
FIG. 5 illustrates a mesh topology estimate generated by the system of FIG. 1 for the defect in FIG. 4.
Figure 5:
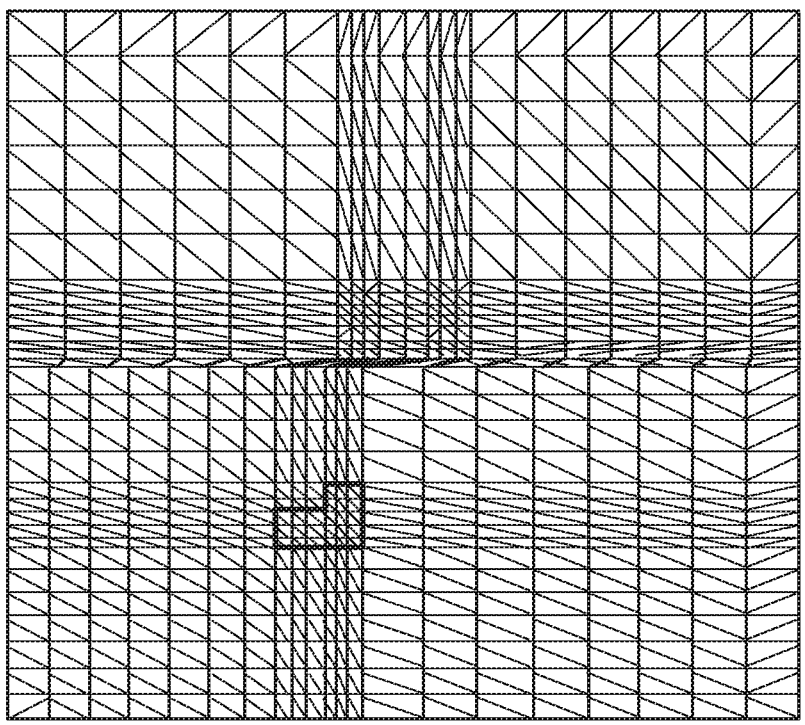

FIG. 4 illustrates a parametrically described crack in a steel sample excited by an eddy current probe. P1-P6 are the lengths that represent the position and shape of the crack, J is current density, and $\mu_r$ is relative permeability. In this example, these parameters are to be optimized to make the computed fields match the measurements. A mesh generator (e.g., FIG. 1) constructs a mesh for the specific problem defined to the parameters. As the parameters change, the mesh topology is fixed, pulling, and crunching triangles, as shown in FIG. 5, by the mesh generator. Such problem-specific meshes are difficult to execute because they restrict the geometry, lack flexibility, and take time for modifications; hence the use of a general-purpose parametric mesh generators.

The present techniques employ parametric defect detection, see, e.g., FIG. 1. Although, in some specific examples, a non-parametric mesh generator is used, specifically the mesh generator Triangle (available from Jonathan Richard Shenchuk, Science Division, University of California at Berkley, which generates exact, constrained, and conforming Delaunay triangulations, and Voronoi diagrams to yield high-quality triangular meshes without large angles and is well suited to finite element analysis. It will be appreciated that any number of mesh generators may be used in the present techniques, including parametric mesh generators. Further, the system of FIG. 1 can implemented for defect and structural shape design and/or defect detection, using these mesh generation techniques.

The mesh generators may apply different geometrics. For example, the system may use the mesh generator Triangle, a tetrahedral mesh generator, or one that applies any number of other suitable geometries. TetGen (available from Hang Si, Research Group: Numerical Mathematics and Scientific Computing, Weierstrass Institute for Applied Analysis and Stochastics (WICS) Berlin, Germany) is a known mesh generator for tetrahedral mesh generation and is more effective than previous methods at removing slivers from and for producing Delaunay optimal tessellations. Many of these mesh generators have their own merits, but no parametric mesh generation capability. In some examples, a parametric mesh generator, such as CEDRAT's suite Flux (available from Cedrat Company of Cedex, France) may be used, where, as parameters are changed, the mesh is generated and the device analyzed to study the effect of those parameters on performance.

In any event, in the present techniques, the mesh generator has been modified as part of an analysis to include non-stop optimization, i.e., continuous, parallel self-optimized operation. Parameters are passed, in real-time, between a dedicated mesh generator and a finite element modeler, where both operate in parallel during execution cycles, as shown in FIG. 1.

The parallelization herein may be achieved through the use of a scripting exchange module (e.g., module 210) that uses a parametric description of the system under examination to start the mesh from initial parameters and thereafter to execute mesh generation seamlessly without stopping as the parameters are updated by the optimization process. The scripting exchange module provides input while the mesh generator is iteratively running, input that is normally made in the mesh generator being used, but for which the optimization iterations cannot stop. At the end of each iteration, the input to the script exchange module, from the mesh generator, is saved for the next finite element module iteration.

Because this mesh generator does not compute gradients, the defect detection system may use a genetic algorithm for optimization. To achieve continuous, run-time operation, this genetic algorithm (GA) and the finite element module are implemented on a dedicated GPU. With the genetic algorithm optimization, several copies of the finite element matrix are held on the GPU and corresponding solutions on parallel threads attempted by the GA.

Separately, the mesh generation is implemented on a dedicated CPU, e.g., using a mesh generator like Triangle. Since solution time can be significant compared to mesh generation time, this approach of doing only matrix solution on the GPU works satisfactorily in terms of yielding practicable times for field testing the armor of ground vehicles after improved explosive device (IED) attacks, for example. Communication between the two processors is achieved through the script exchange module.

In an example implementation, the GPU (e.g., 208) uses an NVIDIA GPU architecture composed of streaming multiprocessors, each containing a number of streaming processor cores on-chip memory, and a single instruction unit. All state machines (SMs) have access to a global memory, the off-chip memory (DRAM), which has a latency of several hundred clock cycles. The architecture of the NVIDIA GPU, termed Compute Unified Device Architecture (CUDA) includes parallel compute engines inside the NVIDIA GPU's. The GPU includes operating system kernel-level support for hardware initialization, configuration, etc. The CUDA driver provides a device-level application programming interface for developers and Parallel Thread Execution Instruction Set Architecture (PTX ISA) for parallel computing kernels and functions. Effectively, the GPU gives parallel computation power without the cost and memory bottlenecks of a shared memory supercomputer.

Figure 7B:
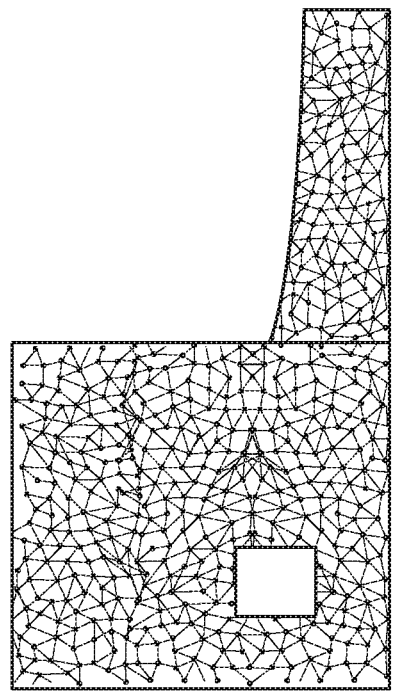
FIGS. 7A and 7B illustrate another example of an optimization defect detection performed by the system of FIG. 1.
Figure 7A:
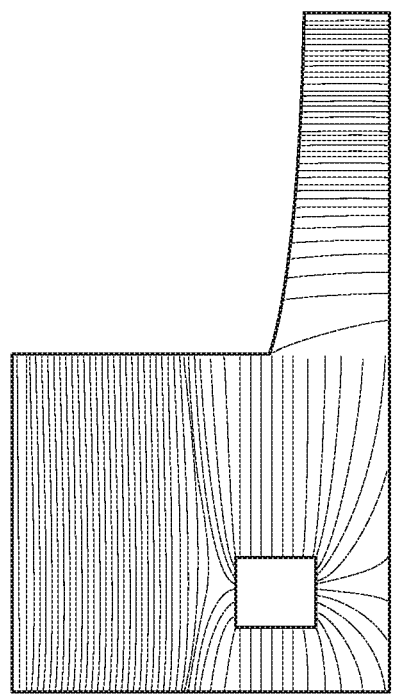

FIGS. 6A and 6B illustrate various examples of optimized defect detection and shape characterization, obtained using the architecture of FIG. 1. FIG. 6A illustrates an initial defect shape and mesh model as determined by a mesh generator. FIG. 6B illustrates the equipotential lines for the identified defect and boundary conditions for the plate under examination. These boundary conditions form part of the objective function by which the finite element model mesh analysis will be measured. FIGS. 7A and 7B illustrate the mesh model and equipotential lines, respectively, after 10 cycles of parallel optimizations using the defect detection system of FIG. 1.

Figure 8A:
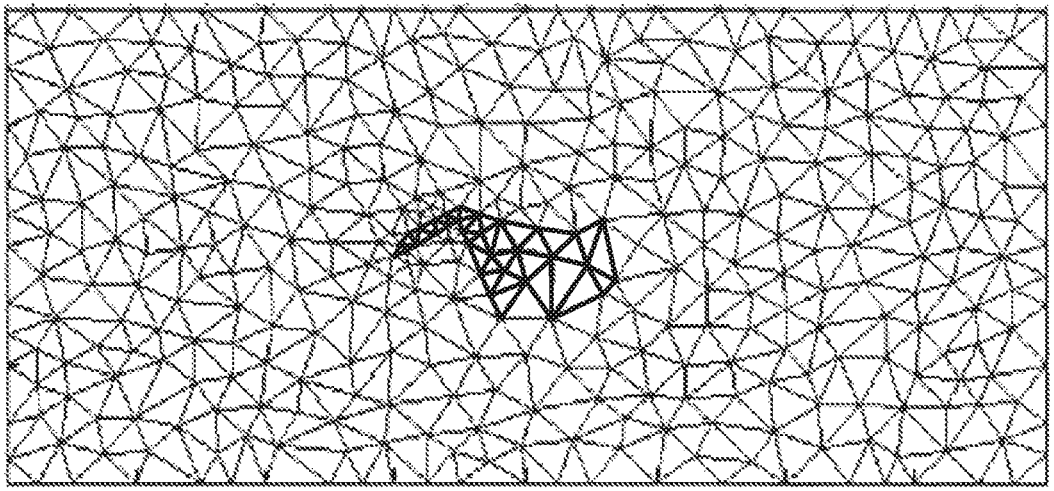
FIGS. 8A and 8B illustrate yet another example of optimization defect detection performed by the system of FIG. 1.
Figure 8B:
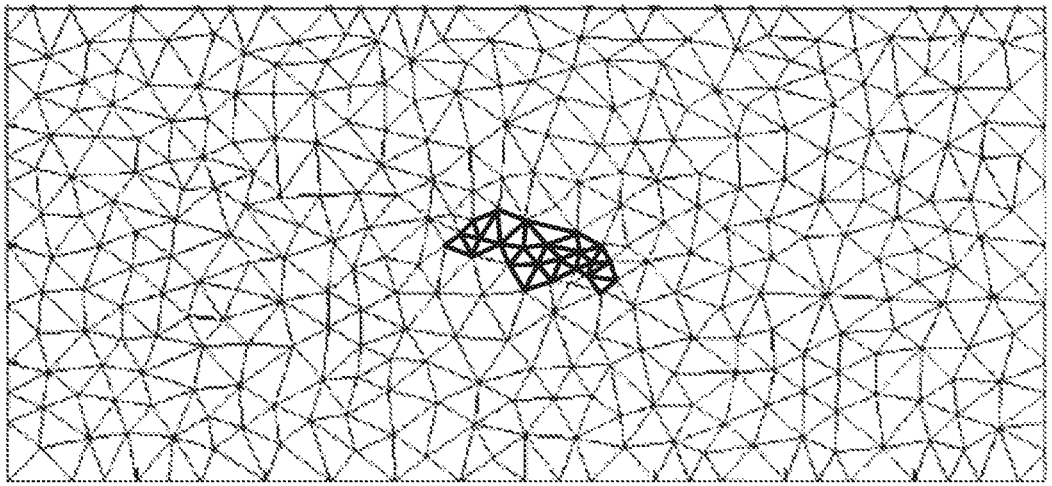

FIGS. 8A and 8B illustrate another example of a defect detection for non-destructive evaluation (NDE), this time simulating the plate of an armored vehicle hit by an IED. The testing could be of a regular rust mitigation maintenance evaluation as well.

Figure 9:
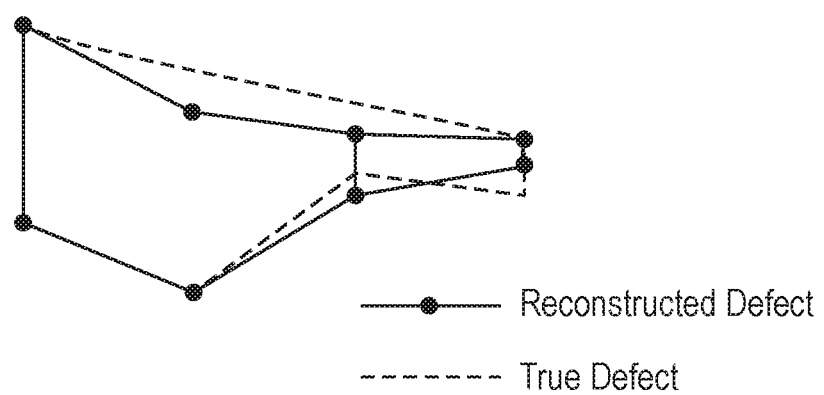
FIG. 9 illustrates an isolated view of the optimized defect detection that shows the actual defect of FIGS. 8A and 8B against the reconstructed defect.

FIG. 8A illustrates the initial mesh model shape of the defect (marked in the center of the diagram. FIG. 8B illustrates the final mesh model shape after optimization using the system of FIG. 1. The optimization was highly accurate. The normalized least-square mismatch of nodes from the mid-point between the measured and computed shapes was close to 90% for the number of iterations used in this example (see, FIG. 9). The error in location was 4%. These values represent exceedingly low error and demonstrate the effectiveness of the defect detection system. Furthermore, the accuracy of these values may be increased further with further optimized objective functions, or the use of additional parameters more broadly.

Figure 10:
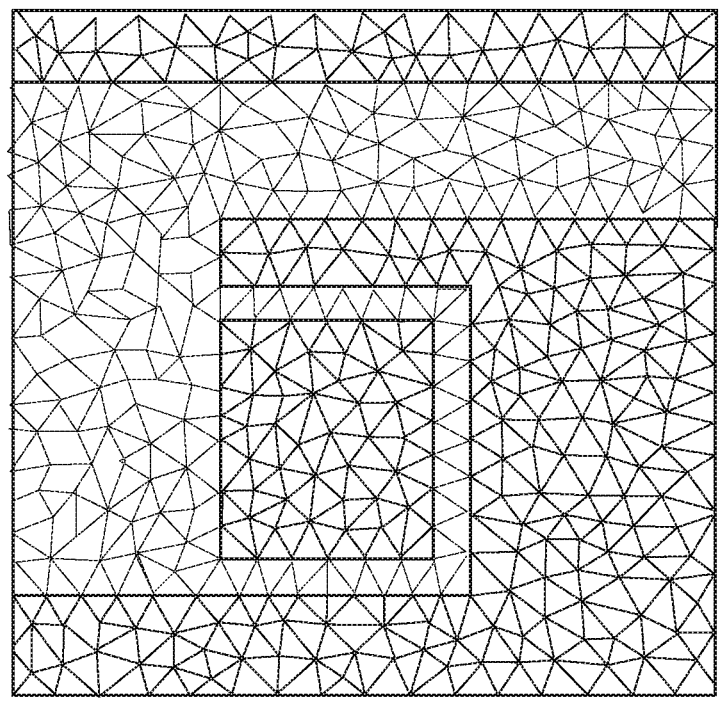
FIG. 10 illustrates a system for optimization, in an initial state for that system.
Figure 10:
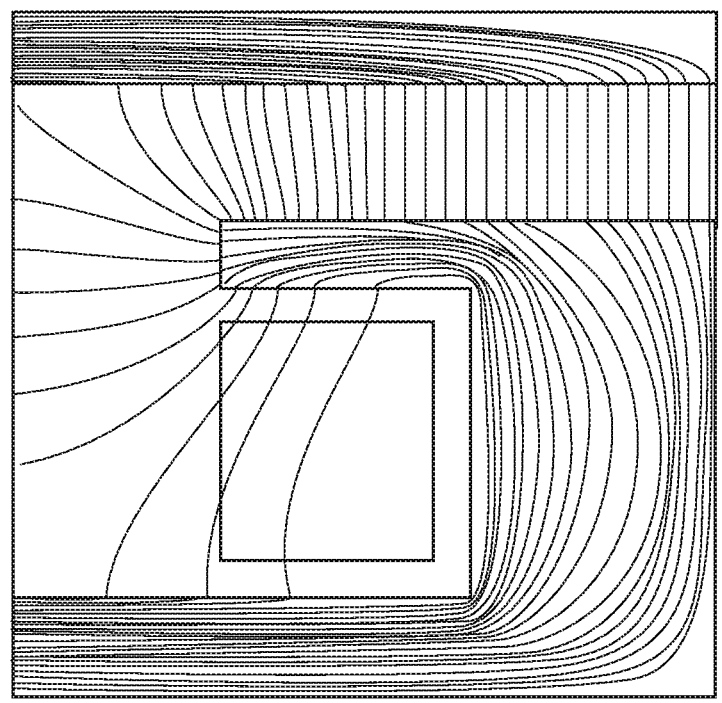

In yet another example, from magnetics, the defect detection system was used to perform structural mapping of an alternator rotor shape optimized for a sinusoidal flux distribution. FIG. 10 illustrates an initial mesh modeled with 16 parameters to get a smooth contour with line segments. The objective function is a least-square difference between the desired flux density (sinusoidal at measuring points normal to the stator) and that computed. The constraints used were limits on the current density and leakage flux, as well as the air-gap size. The defect detection system was used to solve for the magnetic vector potential A, governed by $$-\frac{1}{\mu}\nabla^2 A = J \quad (1)$$

where $\mu$ is the permeability and as before, J is the current density. FIG. 10 gives the initial shape and solution, and FIG. 11 gives an optimal shape and solution, as modeled by the parameters, and after 30 cycles of optimization by the system of FIG. 1.

Figure 11:
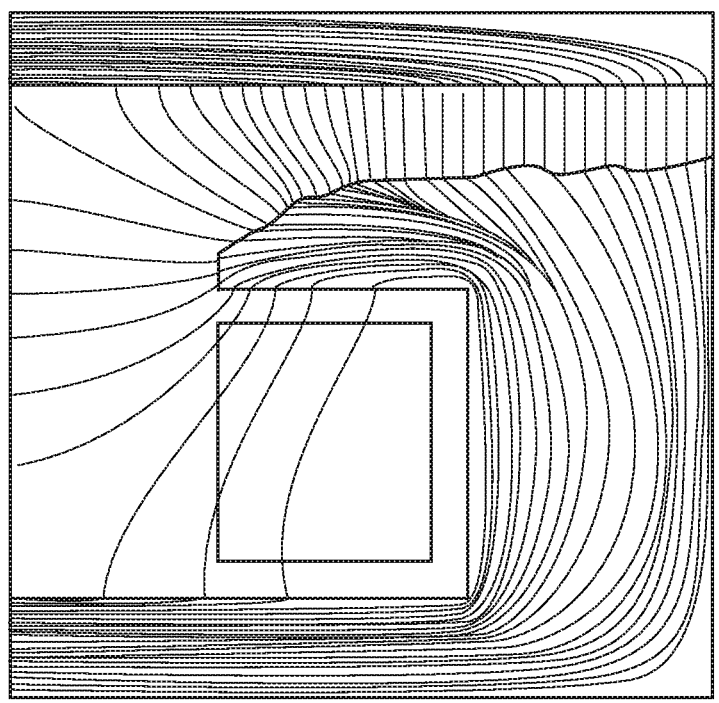
FIG. 11 illustrates an optimized model of the system in FIG. 10, as developed by the system in FIG. 1.
Figure 12:
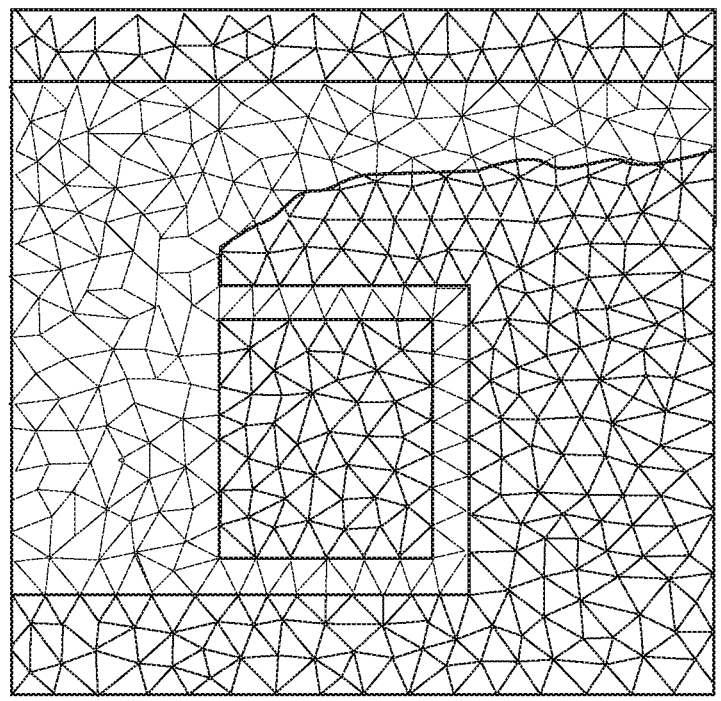
FIG. 12 illustrates a further optimized, smoothed version of the optimization model of FIG. 11.
Figure 12:
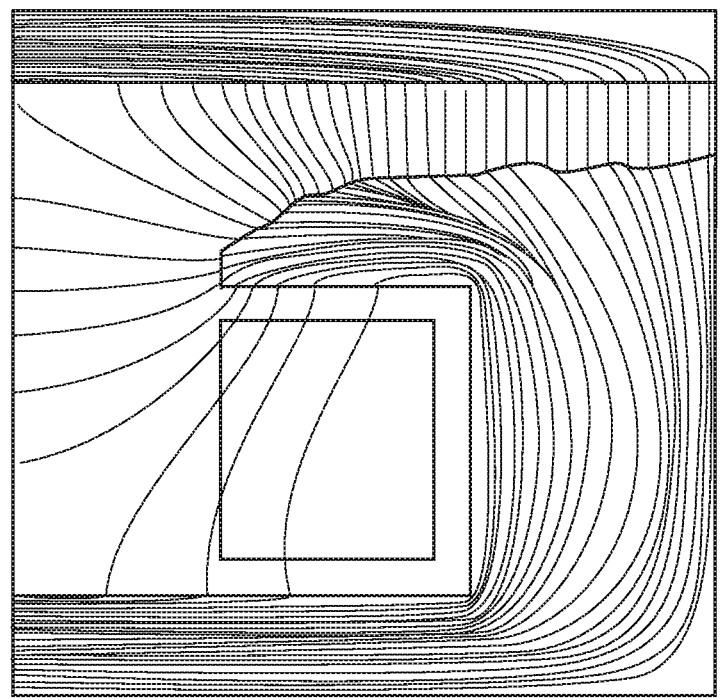

FIG. 11 shows the equipotential lines (i.e., flux lines in magnetics) for the optimum solution. The shape and solution have sharp corners but are otherwise reasonably smooth. In other examples, the defect detection system may employ an averaging technique to remove the sharp bends, where the amount of averaging will determine the amount of shaping on the corners. In an example, the defect detection system took five (5) neighboring values of a height and calculated the mean for every variable solution with suitable modification for boundary variables to get the shape of FIG. 12. The added smoothing may occur during the mesh generation and optimization process, for example. This smoothing process did not significantly move the objective function away from the minimum, nor did it substantially increase the finite element computational time, GA optimization time, or other factors.

Figure 13:
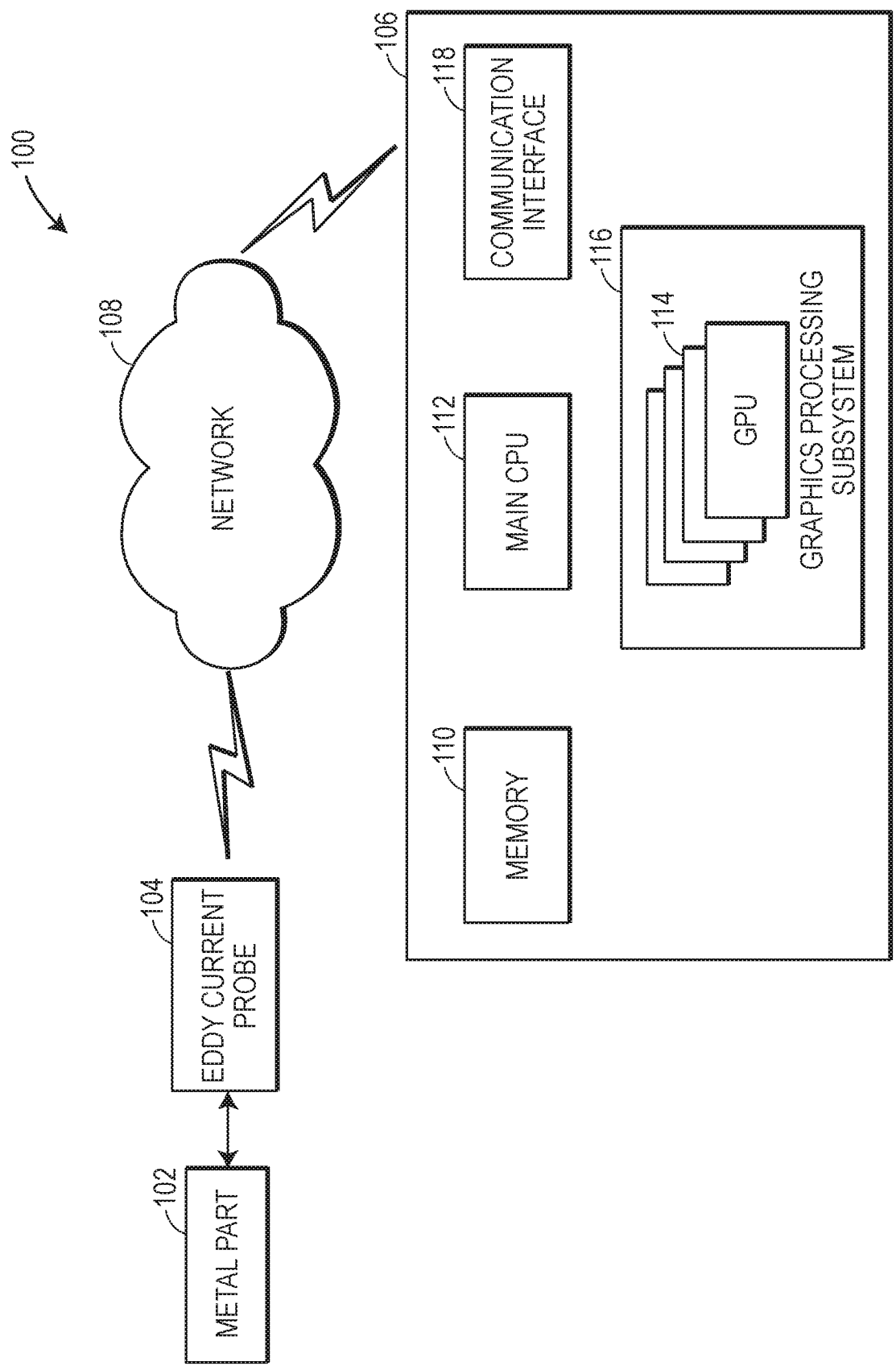
FIG. 13. Illustrates an eddy-current-based characterization system, for defect detection and/or sample construction and design, and that may implement the system of FIG. 1

FIG. 13 illustrates an eddy current defect characterization system 100 in accordance with an example and that may be used to implement the system 200. The system 100 is used to detect for defects in a subject 102 (e.g., an outer metal part of a military) using an eddy current probe 104 connected to a mesh analysis system 106 through a wireless (or wired) communication network 108. The mesh analysis system 106 comprises one or more non-transitory, computer-readable memories 110 that store instructions executable by one or more main processors (e.g., a central processing unit, including in some examples a multi-core or multiple CPU-core processor) 112 and/or one or more secondary processors 114. In the illustrated example, the secondary processors 114 are graphics processing units (GPU) threads 114 running simultaneously on a graphics processing subsystem 116, such as described hereinabove. A communication interface 118 in the mesh analysis system 106 communicates with the eddy current probe 104, sending instructions to the probe 104 and receiving data indicating a flux change detected in the subject 102, from a state where there is no defect to a state where there is a defect.

The memory 110 is coupled to the processor(s) 112 and the GPU threads 114 to cause the processor(s) 112 to generate a plurality of finite element mesh models of the defect detected by the probe 104. The processor(s) 112 sends the finite element mesh models to the plurality of GPU threads 114, where each thread receives a different mesh model. In parallel, the GPU threads 114 perform finite element optimizations on the respective finite element mesh models. From there, these optimizations are communicated to the processor(s) 112 to serve as inputs to the next iteration cycles finite element mesh model generation. In other examples, these optimizations are evaluated each cycle by an objective function executed by each GPU thread 114, and using a genetic algorithm to identify optimized finite element mesh models. The subset of optimized finite element mesh models may then be communicated back to the CPU 112 for the next round of finite element mesh model generation.

The memory 110 may store instructions for instantiating the optimization module (e.g., the generic algorithm module and finite element module) on the processor 116 (e.g., in each of the GPU threads 114). The memory 110 may store instructions for instantiating the mesh generation module on the processor 112. And the scripting exchange module may be instantiated on either of these processors 112/116 or accessible by each. In any event, these processes would continue until one finite element mesh model of the defect satisfies a minimum objective function value.

As shown, the techniques described herein provide a defect detection system that employs a script-based, parameterized mesh generator for non-destructive evaluation for finite element optimization. Moreover, the present techniques may be implemented using open-source code (e.g., mesh generators) that may be adapted to problem-specific finite element optimization systems thereby facilitating parallel processing operations, in which mesh generation and finite element analysis are performed in parallel on separate dedicated processing threads, and with a script management module exchanging data between the mesh generator and finite element analysis modules in each cycle to automate and expedite optimization.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Additionally, certain embodiments are described herein as including logic or a number of routines, subroutines, applications, or instructions. These may constitute either software (e.g., code embodied on a machine-readable medium or in a transmission signal) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses) that connects the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of the example methods described herein may be performed, at least partially, by one or more processors that are temporarily configured (e.g., by software) or that are permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods or routines described herein may be at least partially processor-implemented. For example, at least some of the operations of a method may be performed by one or more processors or by processor-implemented hardware modules. The performance of certain of the operations may be distributed among the one or more processors, not only residing within a single machine (having different processing abilities), but also deployed across a number of machines. In some example embodiments, the processors may be located in a single location (e.g., deployed in the field, in an office environment, or as part of a server farm), while in other embodiments the processors may be distributed across a number of locations.

Unless specifically stated otherwise, discussions herein using words such as "processing," "computing," "calculating," "determining," "presenting," "displaying," or the like may refer to actions or processes on a GPU thread that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase in "one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, or refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description, and the claims that follow, should be read to include one or at least one and the singular also includes the plural unless it is obvious that it is meant otherwise.

This detailed description is to be construed as an example only and does not describe every possible embodiment, as describing every possible embodiment would be impractical, if not impossible. One could implement numerous alternate embodiments, using either current technology or technology developed after the filing date of this application.

What is claimed:

1. An eddy current defect characterization system comprising:
    an eddy current probe adapted to produce a changing magnetic field extending outwardly from the eddy current probe to induce eddy currents in an electrically conducting specimen, wherein the eddy current probe includes a sensing coil to detect a flux change from a state where there is no defect over the electrically conducting specimen in response to the induced eddy currents;
    a mesh analysis system having one or more main processors and one or more dedicated graphics processing unit (GPU) threads, the mesh analysis system having:
    one or more non-transitory computer readable memories coupled to the one or more main processors and to the one or more dedicated GPU threads, wherein the one or more non-transitory computer readable memories include computer-executable instructions stored therein that, when executed by the one or more main processors or the one or more dedicated GPU threads, cause the one or more main processors or the one or more dedicated GPU threads to:
    in response to detecting the flux change in the electrically conducting specimen, generate, in the one or more main processors, a plurality of finite element mesh models of a defect in the electrically conducting specimen;
    in parallel,
        (i) provide each of the plurality of finite element mesh models to a different one of the one or more dedicated GPU threads, and
        (ii) perform, in each of the one or more dedicated GPU threads, a finite element optimization on the respective finite element mesh model, and perform either (iii) or (iv)
        (iii) continuously communicate the finite element optimizations from the one or more dedicated GPU threads to the one or more main processors as an input to the finite element mesh model's mesh generation procedure, causing the generation of a new full mesh with new model connectors based on each finite element optimization; or
        (iv) evaluate, in each of the one or more dedicated GPU threads, an objective function for each respective finite element mesh model using a genetic algorithm to identify one or more optimized finite element mesh models, and in response to the genetic algorithm evaluation, continuously communicate the one or more optimized finite element mesh models to the one or more main processors to serve as an input to the finite element mesh model generation process, causing the generation of a new full mesh with new model connectors based on each optimized finite element mesh model; and
    continue to generate the plurality of finite element mesh models of the defect in the electrically conducting specimen until at least one of the finite element mesh models satisfies a minimum objective function value.

2. The eddy current defect characterization system of claim 1, wherein the one or more non-transitory computer readable memories include computer-executable instructions stored therein that causes the one or more main processors to perform a different finite element mesh model generation process such that each generated mesh model has a different mesh shape.

3. The eddy current defect characterization system of claim 1, wherein the one or more non-transitory computer readable memories include computer-executable instructions stored therein that causes the one or more dedicated GPU threads to each use a matrix computation having element-by-element Gaussian iterations for the finite element optimization.

4. The eddy current defect characterization system of claim 1, wherein the one or more non-transitory computer readable memories include computer-executable instructions stored therein that causes the one or more dedicated GPU threads to determine a parametric description of the defect by optimizing a difference between (i) measured electric field/voltage profiles from the eddy current probe and (ii) computed electric field/voltage profiles from the finite element optimizations of the one or more dedicated GPU threads.

5. A computer-implemented method of identifying a defect in an electrically conducting specimen, the method comprising:
    (a) receiving, from an eddy current probe, measure voltage profile data from scanning the electrically conducting specimen for a defect, wherein the measured voltage profile data includes flux change data when the defect is encountered in the electrically conducting specimen;
    (b) generating a plurality of finite element mesh models from the measured voltage profile data;
    (c) performing, in parallel, a finite element optimization on each of the plurality of finite element mesh models using Gauss iterations, causing the generation of a new full mesh with new model connectors based on each finite element optimization;
    (d) determining, in parallel and from the finite element optimizations, computed voltage profile data and determining an objective function for each of the plurality of finite element mesh models by determining a square of the difference between the measured voltage profile data and computed profiles;

(e) optimizing, in parallel, each of the objective functions using a genetic algorithm optimization; and (f) determining the objective function having a minimum value set of parameters as describing the defect.

6. The computer-implemented method of claim 5, wherein generating the plurality of finite element mesh models from the measured voltage profile data comprises:
performing a different finite element mesh model generation process such that each generated mesh model has a different mesh shape.

7. The computer-implemented method of claim 5, further comprising using a matrix computation having element-by-element Gaussian iterations for each finite element optimization.

8. The computer-implemented method of claim 5, further comprising determining a parametric description of the defect by optimizing a difference between (i) measured electric field/voltage profiles from the eddy current probe and (ii) computed electric field/voltage profiles from the finite element optimizations of one or more dedicated GPU threads.

9. A non-transitory, computer-readable storage medium having stored thereon a set of instructions, executable by one or more main processors or one or more dedicated graphics processing unit (GPU) threads, for characterizing a defect in an electrically conducting specimen the defect detected by an eddy current probe, the instructions comprising:
instructions to, in response to detecting a change in flux in the electrically conducting specimen, generate, in the one or more main processors, a plurality of finite element mesh models of a defect in the electrically conducting specimen;
instructions to, in parallel,
(i) provide each of the plurality of finite element mesh models to a different one of the one or more dedicated GPU threads, and
(ii) perform, in each of the one or more dedicated GPU threads, a finite element optimization on the respective finite element mesh model, and perform either (iii) or (iv)
(iii) continuously communicate the finite element optimizations from the one or more dedicated GPU threads to the one or more main processors as an input to the finite element mesh model's mesh generation procedure, causing the generation of a new full mesh with new model connectors based on each finite element optimization, or
(iv) evaluate, in each of the one or more dedicated GPU threads, an objective function for each respective finite element mesh model using a genetic algorithm to identify one or more optimized finite element mesh models, and in response to the genetic algorithm evaluation, continuously communicate the one or more optimized finite element mesh models to the one or more main processors to serve as an input to the finite element mesh model generation process, causing the generation of a new full mesh with new model connectors based on each optimized finite element mesh model; and
instructions to continue to generate the plurality of finite element mesh models of the defect in the electrically conducting specimen until at least one of the finite element mesh models satisfies a minimum objective function value.

10. The non-transitory, computer-readable storage medium of claim 9, wherein the instructions comprise instructions that cause the one or more main processors to perform a different finite element mesh model generation process such that each generated mesh model has a different mesh shape.

11. The non-transitory, computer-readable storage medium of claim 9, wherein the instructions comprise instructions that cause the one or more dedicated GPU threads to each use a matrix computation having element-by-element Gaussian iterations for the finite element optimizations.

12. The non-transitory, computer-readable storage medium of claim 9, wherein the instructions comprise instructions that cause the one or more dedicated GPU threads to determine a parametric description of the defect by optimizing a difference between (i) measured electric field/voltage profiles from the eddy current probe and (ii) computed electric field/voltage profiles from the finite element optimizations of the one or more dedicated GPU threads.

* * * * *

UNITED STATES PATENT AND TRADEMARK OFFICE
CERTIFICATE OF CORRECTION

PATENT NO. : 10,949,584 B2
APPLICATION NO. : 15/160453
DATED : March 16, 2021
INVENTOR(S) : S. Ratnajeevan H. Hoole et al.

It is certified that error appears in the above-identified patent and that said Letters Patent is hereby corrected as shown below:

In the Claims

At Column 11, Line 65, Claim 1 "(iv)" should be -- (iv); --.

At Column 13, Line 40, Claim 9 "(iv)" should be -- (iv); --.

Signed and Sealed this
Sixth Day of July, 2021

Drew Hirshfeld
*Performing the Functions and Duties of the
Under Secretary of Commerce for Intellectual Property and
Director of the United States Patent and Trademark Office*